United States Patent [19]
Patz et al.

[11] Patent Number: 5,698,039
[45] Date of Patent: Dec. 16, 1997

[54] PROCESS FOR CLEANING A SUBSTRATE USING A BARRIER DISCHARGE

[75] Inventors: Ulrich Patz, Linsengericht; Michael Scherer, Rodenbach, both of Germany; Willi Neff, Kelmis, Belgium; Klaus Pochner, Aachen, Germany

[73] Assignees: Leybold AG, Hanau am Main; Fraunhofer-Gesellschaft zur Forderung der angewandten Forschung e.V., Munich, both of Germany

[21] Appl. No.: 587,470

[22] Filed: Jan. 17, 1996

[30] Foreign Application Priority Data

Feb. 4, 1995 [DE] Germany ............... 19503718.9

[51] Int. Cl.⁶ ................ B08B 7/00; C23C 14/00
[52] U.S. Cl. ................ 134/1.1; 134/1.2; 134/1.3; 134/2; 204/298.02; 204/192.1
[58] Field of Search ............... 134/1, 1.1, 1.2, 134/1.3, 2; 204/298.11, 192.1, 298.01, 208.02, 298.16, 198.04, 192.12, 192.25

[56] References Cited

U.S. PATENT DOCUMENTS

| | | | |
|---|---|---|---|
| 5,173,638 | 12/1992 | Eliasson et al. | 313/634 |
| 5,427,747 | 6/1995 | Kong et al. | 422/186 |
| 5,444,331 | 8/1995 | Matsuno et al. | 313/553 |
| 5,458,856 | 10/1995 | Marie et al. | 422/186 |
| 5,510,158 | 4/1996 | Hiramoto et al. | 427/582 |
| 5,581,152 | 12/1996 | Matsuno et al. | 313/636 |

FOREIGN PATENT DOCUMENTS

| | | |
|---|---|---|
| 0254111 | 1/1988 | European Pat. Off. . |
| 4113523 | 10/1992 | Germany . |
| 9509256 | 4/1995 | WIPO . |

OTHER PUBLICATIONS

Volkova et al. "Vacuum–Ultraviolet Lamps with a Barrier Discharge in Inert Gases" Journal of Applied Spectroscopy, vol. 41, No. 4, pp. 1194–1197 (Oct. 1984).

Primary Examiner—Timothy McMahon
Assistant Examiner—Alexander Markoff
Attorney, Agent, or Firm—Felfe & Lynch

[57] ABSTRACT

A barrier discharge device (4a, 4b, 4c) installed in a vacuum chamber (1) consists essentially of at least two facing electrodes (20, 22); a dielectric (22) situated between the electrodes (20, 22) and in the immediate proximity of one of these electrodes (20); and a power source (26), which is connected electrically to the electrodes (20, 22). The plasma particles and UV radiation generated during the electrical discharge between the electrodes (20, 22) pass through the electrode (22), which is permeable to UV radiation and plasma particles, and thus emerge from the discharge space. On the surfaces (5a, 5b), the UV radiation induces a photochemical cleaning process, and the impinging plasma particles induce a plasma-chemical cleaning process. The cleaning process is essentially independent of pressure and can be used at pressures of up to 10 bars, which means that the cleaning process can be operated in particular during the time in which the vacuum chamber (1) is being pumped out.

10 Claims, 3 Drawing Sheets

PROCESS FOR CLEANING A SUBSTRATE USING A BARRIER DISCHARGE

BACKGROUND OF THE INVENTION

The invention pertains to a process for treating and especially for cleaning surfaces.

The coating of surfaces by means of vacuum-assisted processes such as sputtering or coating in a vapor deposition process with thermally activated coating substances usually requires that the surfaces be cleaned prior to coating.

It is known that such surfaces can be cleaned by the use of a plasma, especially by means of a glow discharge, which is generated either in the coating chamber itself or in a separate cleaning chamber. After the surfaces to be cleaned have been transferred to the cleaning chamber, they are exposed to a plasma burning in front of the surfaces under glow discharge conditions. The action of the particles from the plasma striking the surface loosens the impurities adhering to the surface. To ignite and to maintain the glow discharge, it is necessary not only to have a defined ignition potential between the ignition electrodes but also to arrive at a minimum pressure for the plasma process gas. This minimum pressure is usually achieved by pumping out the vacuum chamber by the use of vacuum pumps, but it is a disadvantage that this process necessitates a certain waiting period. In glow discharge cleaning, furthermore, care must also be taken to ensure that the glow discharge is operated at a constant chamber pressure, because the effectiveness of plasma cleaning depends strongly on the pressure. To keep the chamber pressure stable, it is therefore necessary to install a complicated manual or automatically controlled pressure control system, which is disadvantageous.

To be able to maintain the proper discharge conditions without impairment to the processing equipment used for the coating process, cleaning can be carried out in a separate vacuum chamber in which only the glow discharge system components are installed. This makes the overall cleaning process before vacuum coating both time-consuming and economically challenging.

SUMMARY OF THE INVENTION

The task of the invention is to provide a cleaning process for surfaces to be coated under vacuum conditions which avoids the disadvantages described above.

This task is accomplished by using a dielectrically hindered discharge to clean the surfaces in the vacuum chamber. The discharge equipment required to generate the dielectrically hindered discharge, which is also referred to as a "barrier discharge", consists essentially of at least two electrodes, a dielectric installed in the discharge space between the electrodes, and a power source connected to the electrodes. The basic way in which a barrier discharge such as this works according to the state of the art is explained in more detail in the Journal of Applied Spectroscopy, Vol. 41, No. 4, pp. 1,194–1,197, October 1984. In the cleaning process brought about by the dielectrically hindered discharge, the impurities which have accumulated on the surface are either as a result of a photochemical decomposition process attributable to the UV radiation which is emitted by the discharge and then falls on the surface, or by a plasma-chemical decomposition process attributable to the plasma particles which emerge from the discharge plasma of the dielectric discharge and strike the surface directly. Depending on the design of the barrier discharge system, it is possible for cleaning to be accomplished by means of photochemical and plasma-chemical decomposition simultaneously.

The advantage of barrier discharge systems such as this is that, in general, it is possible to operate them in a pressure range of up to 10 bars. As a result, the use of this process also makes it possible in particular for work to be carried out under atmospheric pressure conditions. The cleaning process can therefore be started as soon as the surface to be cleaned has arrived in the vacuum chamber and can be continued during evacuation as long as the pressure is sufficiently high to sustain the discharge ($>5\times10^{-1}$ mbar). Thus the cleaning process itself and the overall coating process require less time. The time savings achieved through the elimination of this waiting period is about 25–30% relative to the total process cycle time for a substrate body to be coated. Because a barrier discharge is subject to only slight limitations with respect to the pressure conditions, there is no need to provide an additional vacuum chamber for cleaning. As a result, the cleaning process also becomes quite economical. The impurities released into the gas phase during the cleaning process are pumped out during the evacuation process, as a result of which these impurities are prevented from settling back onto the cleaned surfaces again during the coating process, which is significant advantage.

It is possible to provide surfaces which have been cleaned in this way with individual metallic or plastic-containing layers or sequences of such layers in a subsequent coating process, especially by means of sputtering and/or vapor deposition process. After the surfaces have been cleaned, such coatings adhere directly to the substrate support and thus have a defined adhesive strength.

It is possible to clean the surfaces in question not only by the action of a dielectrically hindered discharge but also, as an additional cleaning method, by the action of a glow discharge at a succeeding station. It can be highly advantageous to combine these two cleaning processes. For example, the barrier discharge can be operated during the evacuation phase as preliminary cleaning step, and the glow discharge can then be ignited as soon as the required pressure range ($6\times10^{-2}$ mbar to $10^{-1}$ mbar) has been reached.

Because the dielectrically hindered discharge cleans the surface with little or no heating, this process is suitable for cleaning many surfaces consisting of a wide variety of materials. This type of discharge is especially advantageous, however, for the cleaning of surfaces which cannot be subjected to thermal stress such as the surfaces of certain plastics, especially the surfaces of objects made of thermoplastics and polyethylenes.

A dielectrically hindered discharge system and a process according to the invention are explained in greater detail in the advantageous exemplary embodiments shown in FIGS. 1–3.

DETAILED DESCRIPTION OF THE PREFERRED EMBODIMENT

Figure 1:
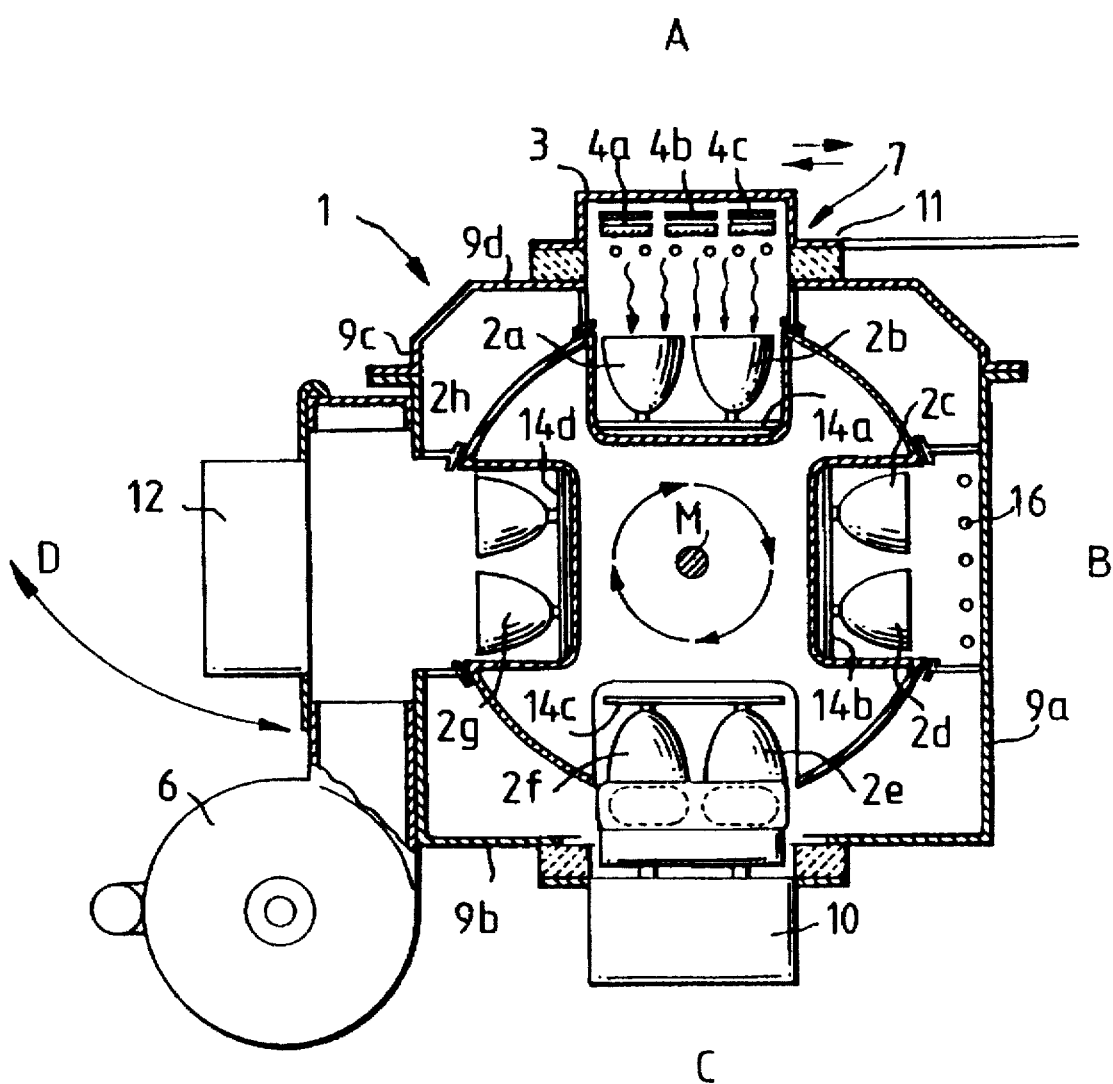
FIG. 1 shows a cross section through a vacuum coating chamber with an integrated barrier discharge system.
Figure 2:
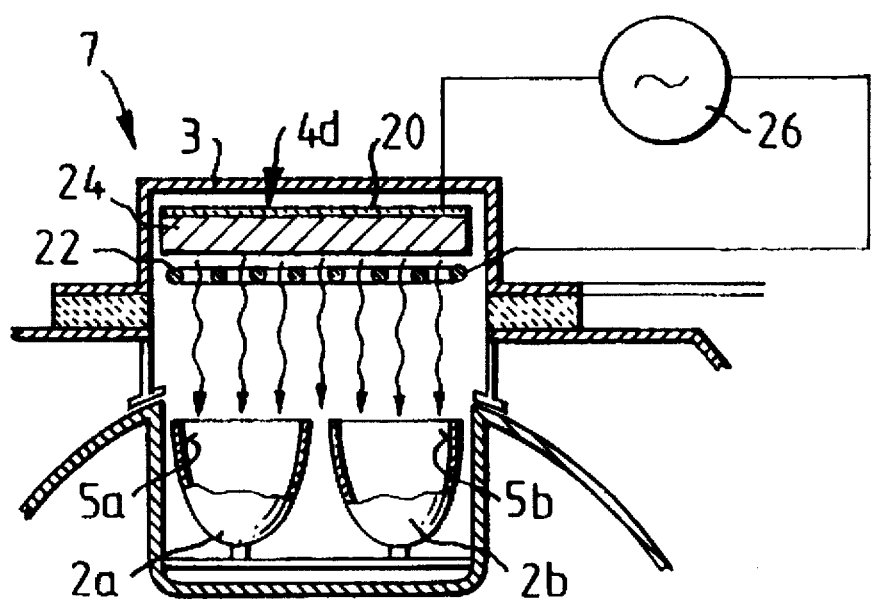
FIG. 2 shows a detailed part of FIG. 1 on an enlarged scale.

The vacuum coating chamber shown in FIG. 1 consists essentially of an evacuatable vacuum chamber 1, which has an essentially rectangular base. Vacuum processing stations A, B, C, D are installed facing each other in chamber walls 9a, 9b, 9c, 9d. The surfaces of substrate bodies 2a–2h to be coated (see FIG. 2) are spotlight reflector surfaces 5a, 5b, which are arranged in pairs on holding devices 14a, 14b, 14c, 14d in vacuum chamber 1. To load vacuum chamber 1, substrate bodies 2a–2h are introduced through a lock 7 into vacuum chamber 1. Lock 7 includes a lock door 11, which can slide parallel to chamber wall 9d in the direction of the arrows shown in the figure. Lock door 11 has a recess 3, in which three individual barrier discharge devices 4a, 4b, 4c are installed. These devices are designed in a manner already known in itself and thus are not shown in detail in the drawing. Each device includes a first electrode 20, a second electrode 22, a dielectric 24 mounted in the discharge space between the electrodes and adjacent to one of them, and a power source 26 (FIG. 2). When lock door 11 is closed, barrier discharge devices 4a–4c end up in a position opposite surfaces 5a, 5b to be cleaned and face them together with the plasma volume which emits the UV radiation. After vacuum chamber 1 has been closed by lock 7, the entire chamber is evacuated by vacuum pumps 6. While the chamber is being pumped out to the pressure required for coating, barrier discharge emitters 4a–4c are activated; the UV radiation emerging from the gas excited by the emitters 4a–4c strikes surfaces 5a, 5b and cleans them by a process of photochemical decomposition.

As an alternative to air, any noble gas can be used. In this case, air has to be pumped out of the apparatus until a pressure of $10^{-4}$ mbar has been reached, whereupon the noble gas is admitted and the barrier discharge is ignited. The choice of noble gas depends on the desired UV wavelength. In general, the more energetic the UV radiation is, the more effective is the cleaning effect. Thus, shorter wavelengths are preferred. See EP 0254 111 for excitation wavelengths of various gases.

Using air instead of noble gas has the advantage of saving time for the required time of the complete coating process on behalf of losing some inefficiency by not using noble gas which emission spectra in the UV-region is narrower and less intensive than that of air (see FIG. 4 in Journal of Applied Spectroscopy, supra). If saving pumping time is not important (albeit one of the advantages of this invention), the choice of noble gas depends on the composition of the thin film polluting the substrate, because different polluting material has different absorption spectra for UV-radiation. Thus the energy absorption by the polluting material is dependent on the combination UV-radiation and absorbing material from which different efficiencies of cleaning processes result.

After the pressure necessary for the following cleaning and/or coating processes has been reached, which typically takes an evacuation time of about 15 seconds, substrate bodies 2a–2b, which are supported on a carousel 13 rotating around center M of the chamber, are carried around to a second processing station B. At station B, precleaned surfaces 5a, 5b can be subjected to a second cleaning process by means of a glow discharge device 16. Glow discharge is performed either with pure noble gas or a gas mixture of noble gases selected from the group including He, Ne, Ar, Kr, and Xe, and possibly an additional reactive gas, such as F or Cl. As noble gas argon is preferred. The preferred pressure is $6\times10^{-2}$ mbar to $10^{-1}$ mbar. The discharge voltage is about 800 volts DC.

Figure 3:
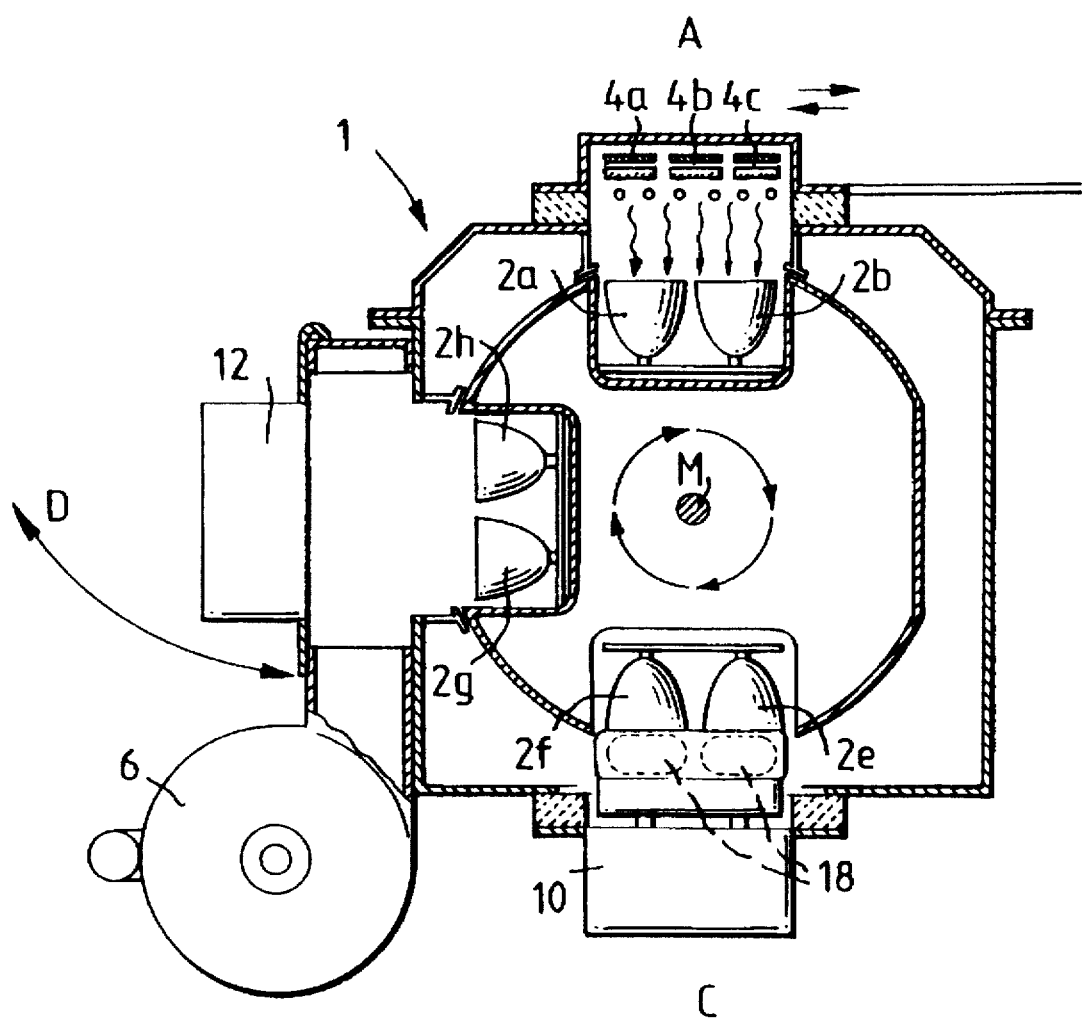
FIG. 3 shows a cross section through a vacuum coating chamber according to a second exemplary embodiment.

If it is desired to dispense with the glow discharge cleaning process, station B can be eliminated as shown in FIG. 3. After substrate body surfaces 5a, 5b have been cleaned at station A and/or B, they are carried further around by carousel 13 until they reach processing station C or D for a vacuum-assisted coating process. They can thus now be coated with, for example, a reflective metal layer by device 10, and then with a transparent protective layer applied on top of the metal layer by means of a protective layer coating device 12. The coating station C may be a well known magnetron sputter source, which would have, e.g., an Al target for making the reflective layer. The sputtering pressure of the process gas, preferably argon, is in the $10^{-3}$ mbar decade. The minimum pressure for plasma ignition is 5–7× $10^{-4}$ mbar.

To remove coated substrate bodies 2a–2h, they are rotated again until they reach removal and loading station A, as indicated by the rotational direction arrows. After lock door 11 has been opened, the bodies can be removed from vacuum chamber 1.

In the embodiment of FIG. 2, a first electrode 20 is designed in the form of a plate. The surface of this plate which faces substrate body surfaces 5a, 5b is covered by a plate 24, which consists of a dielectric substance such as plastic or ceramic. Second electrode 22 consists of a grid assembly, which is partially transparent both to the UV radiation emerging from the discharge space (discharge section) between the dielectric and the second electrode and also to the plasma particles. This electrode design offers the advantage that the radiation source (UV, plasma particle source) acts homogeneously over the entire surface area to be cleaned, which means that the surfaces are cleaned uniformly. To supply electrodes 20, 22 with power, a power source 26 is provided, which is connected in an electrically conductive manner to the electrodes. The power source is RF with a preferred frequency between 100 kHz and 200 kHz, however, lower frequencies can be used. The supply voltage for the discharge depends strongly on the pressure in the vacuum chamber and lies in the range from 3 kV to 16 kV.

What is claimed is:

1. Process for treating a substrate, said process comprising providing barrier discharge means comprising a vacuum chamber containing air, first and second electrode means in said vacuum chamber, dielectric means between said first and second electrode means, and a power source connected across said first and second electrode means, introducing a substrate to be cleaned into the vacuum chamber, generating a plasma by exciting said first and second electrode means with an excitation voltage in the presence of said air, said plasma emitting at least one of UV radiation and particles, and cleaning a substrate by exposing said substrate to said at least one of UV radiation and particles in the vacuum chamber.

2. Process as in claim 1 wherein said first electrode means is further from said substrate than said second electrode means, said dielectric means is closer to said first electrode means than said second electrode means, and said second electrode means is in the form of a grid.

3. Process as in claim 1 wherein said power source is an RF power supply.

4. Process as in claim 3 wherein said RF power supply has a frequency between 100 kHz and 200 kHz.

5. Process as in claim 1 wherein said plasma is generated while said air is being evacuated.

6. Process as in claim 1 further comprising providing a glow discharge station in said vacuum chamber, and cleaning said substrate at said glow discharge station by exposure to a plasma formed by a process gas comprising inert gas.

7. Process as in claim 6 further comprising providing a coating station in said vacuum chamber, and coating said substrate after cleaning at said glow discharge station.

8. Process as in claim 7 wherein said coating is performed by magnetron cathode sputtering.

9. Process as in claim 1 further comprising providing a coating station in said vacuum chamber, and coating said substrate after cleaning at said barrier discharge means.

10. Process as in claim 9 wherein said coating is performed by magnetron cathode sputtering.

* * * * *